United States Patent
Chan et al.

(10) Patent No.: US 10,366,918 B2
(45) Date of Patent: Jul. 30, 2019

(54) SELF-ALIGNED TRENCH METAL-ALLOYING FOR III-V NFETS

(71) Applicant: International Business Machines Corporation, Armonk, NY (US)

(72) Inventors: Kevin K. Chan, Staten Island, NY (US); Sebastian U. Engelmann, White Plains, NY (US); Marinus Johannes Petrus Hopstaken, Carmel, NY (US); Christopher Scerbo, Bronx, NY (US); Hongwen Yan, Somers, NY (US); Yu Zhu, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/284,956

(22) Filed: Oct. 4, 2016

(65) Prior Publication Data
US 2018/0096885 A1 Apr. 5, 2018

(51) Int. Cl.
| | |
|---|---|
| *H01L 21/223* | (2006.01) |
| *H01L 21/768* | (2006.01) |
| *H01L 23/535* | (2006.01) |
| *H01L 29/20* | (2006.01) |
| *H01L 29/66* | (2006.01) |

(Continued)

(52) U.S. Cl.
CPC .... *H01L 21/76814* (2013.01); *H01L 21/2236* (2013.01); *H01L 21/28264* (2013.01); *H01L 21/76805* (2013.01); *H01L 21/76895* (2013.01); *H01L 23/535* (2013.01); *H01L 29/20* (2013.01); *H01L 29/66522* (2013.01); *H01L 29/7834* (2013.01); *H01L 29/207* (2013.01)

(58) Field of Classification Search
CPC ........... H01L 21/76814; H01L 21/2236; H01L 21/28264; H01L 21/76805; H01L 21/76895; H01L 23/535; H01L 29/20; H01L 29/66522; H01L 29/7834; H01L 29/207
See application file for complete search history.

(56) References Cited

U.S. PATENT DOCUMENTS

| | | |
|---|---|---|
| 5,250,467 A | 10/1993 | Somekh et al. |
| 5,356,835 A | 10/1994 | Somekh et al. |

(Continued)

FOREIGN PATENT DOCUMENTS

| | | |
|---|---|---|
| JP | 2011-054787 A | 3/2011 |
| KR | 10-2005-0070319 A | 7/2005 |

(Continued)

*Primary Examiner* — Eric A. Ward
*Assistant Examiner* — Eric K Ashbahian
(74) *Attorney, Agent, or Firm* — Scully, Scott, Murphy & Presser, P.C.; L. Jeffrey Kelly, Esq.

(57) ABSTRACT

After forming source/drain contact openings to expose portions of source/drain regions composed of an n-doped III-V compound semiconductor material, surfaces of the exposed portions of the source/drain regions are cleaned to remove native oxides and doped with plasma-generated n-type dopant radicals. Semiconductor caps are formed in-situ on the cleaned surfaces of the source/drain regions, and subsequently converted into metal semiconductor alloy regions. Source/drain contacts are then formed on the metal semiconductor alloy regions and within the source/drain contact openings.

15 Claims, 5 Drawing Sheets

(51) Int. Cl.
  *H01L 21/28* (2006.01)
  *H01L 29/78* (2006.01)
  *H01L 29/207* (2006.01)

(56) References Cited

U.S. PATENT DOCUMENTS

| | | | | |
|---|---|---|---|---|
| 5,410,160 A * | 4/1995 | Goronkin | ............... | H01L 29/739 257/15 |
| 5,427,981 A * | 6/1995 | Choi | ................ | H01L 21/76877 257/E21.585 |
| 5,738,731 A * | 4/1998 | Shindo | ................. | B81C 1/0038 136/249 |
| 6,271,570 B1 | 8/2001 | Huang et al. | | |
| 7,456,444 B2 | 11/2008 | Bito | | |
| 7,705,377 B2 | 4/2010 | Ohshima | | |
| 2005/0196929 A1* | 9/2005 | Yuan | ..................... | C23C 16/403 438/296 |
| 2009/0250762 A1* | 10/2009 | Liu | ................... | H01L 21/82380 257/369 |
| 2010/0193847 A1* | 8/2010 | Jiang | ................ | H01L 21/28088 257/288 |
| 2012/0025266 A1* | 2/2012 | Griebenow | ....... | H01L 21/28518 257/190 |
| 2012/0193687 A1* | 8/2012 | Kim | ................... | H01L 29/0847 257/288 |
| 2012/0228672 A1* | 9/2012 | Daval | ............... | H01L 21/76254 257/192 |
| 2013/0001555 A1* | 1/2013 | Yin | ................... | H01L 21/28518 257/52 |
| 2013/0052801 A1* | 2/2013 | Berliner | ................ | H01L 21/845 438/468 |
| 2013/0122713 A1* | 5/2013 | Rogers | ............. | H01L 27/11521 438/715 |
| 2014/0106531 A1* | 4/2014 | Cabral, Jr. | ........ | H01L 21/28088 438/299 |
| 2014/0145246 A1* | 5/2014 | Ning | ..................... | H01L 29/812 257/280 |
| 2015/0228730 A1* | 8/2015 | Yang | ..................... | H01L 27/092 257/369 |
| 2015/0235903 A1* | 8/2015 | Guo | .................... | H01L 21/8252 438/285 |
| 2015/0243505 A1* | 8/2015 | Wang | .................. | H01L 29/6681 438/283 |
| 2016/0111537 A1* | 4/2016 | Tsai | .................... | H01L 29/7848 257/192 |
| 2016/0240536 A1* | 8/2016 | Lee | ........................ | H01L 29/207 |

FOREIGN PATENT DOCUMENTS

| | | |
|---|---|---|
| KR | 10-2006-0075045 A | 7/2006 |
| KR | 10-2010-0055825 A | 5/2010 |
| KR | 10-1044467 B1 | 6/2011 |

* cited by examiner

SELF-ALIGNED TRENCH METAL-ALLOYING FOR III-V NFETS

BACKGROUND

The present application relates to III-V compound semiconductor field effect transistors (FETs), and more particularly to III-V compound semiconductor FETs having self-aligned source/drain contacts with low contact resistance.

III-V compound semiconductor materials with high electron mobility have been explored as a new channel material for n-type metal oxide semiconductor FETs (nMOSFETs). For III-V compound semiconductor-based nFETs, low resistance source/drain contacts are critical for the performance and reliability of the FETs. These low resistance source/drain contacts are traditionally done with a Ti/Pd/Au metallurgy. However, this metallurgy has poor thermal stability because Au starts to diffuse into junctions at modest processing temperatures, e.g. greater than 300° C., causing degradation of the gate metal and device shorts. Thus, the prior art metallurgy is not compatible with any high temperature process step following the contact formation. Therefore, there remains a need to develop low resistance and stable source/drain contacts for III-V compound semiconductor-based FETs.

SUMMARY

The present application provides a III-V compound semiconductor FET having source/drain contacts with low contact resistance. By "low contact resistance" it is meant a contact resistance that is lower than $5 \times 10^{-9}$ ohm-cm$^2$. After forming source/drain contact openings to expose portions of source/drain regions composed of an n-doped III-V compound semiconductor material, surfaces of the exposed portions of the source/drain regions are cleaned to remove native oxides. N-type dopants such as Si, Ge, Te or Sn are then introduced on the cleaned surfaces by plasma excitation. Semiconductor caps are formed in-situ on the cleaned surfaces of the source/drain regions, and subsequently converted into metal semiconductor alloy regions. The in-situ formation of the semiconductor caps in the same reaction chamber where the cleaning process is performed prevents re-oxidation of the cleaned surfaces of the source/drain regions. As a result, the contact resistance of the resulting source/drain contacts can be greatly reduced.

In one aspect of the present application, a semiconductor structure is provided. The semiconductor structure includes source/drain regions located on opposite sides of a gate structure that is located on a compound semiconductor channel layer. An interlevel dielectric (ILD) is located on the source/drain regions and laterally surrounds the gate structure. Source/drain contact openings extend through the ILD layer, and each of the source/drain contact openings exposes a portion of one of the source/drain regions. Metal semiconductor alloy regions are located at bottom of the source/drain contact openings, and each of the metal semiconductor alloy region contacts a top surface of the exposed portion of one of the source/drain regions. Source/drain contacts are located within the source/drain contact openings, and each of the source/drain contacts is contact with a top surface of the metal semiconductor alloy regions.

In another aspect of the present application, a method of forming a semiconductor structure is provided. The method includes first forming source/drain regions on opposite sides of a gate structure located on a compound semiconductor channel layer. Source/drain contact openings are then formed extending through an interlevel dielectric (ILD) layer that overlies the source/drain contact regions and laterally surrounds the gate structure. Each of the source/drain contract openings exposes a portion of one of the source/drain contact regions. Next, metal semiconductor alloy regions are formed within the source/drain contact openings. Each of the metal semiconductor alloy regions is located at a bottom of one of the source/drain contact openings and contacts a top surface of the exposed portion of one of the source/drain regions. Source/drain contacts are subsequently formed within the source/drain contact openings. Each of the source/drain contacts is in contact with a top surface of one of metal semiconductor alloy regions.

DETAILED DESCRIPTION

Figure 1:
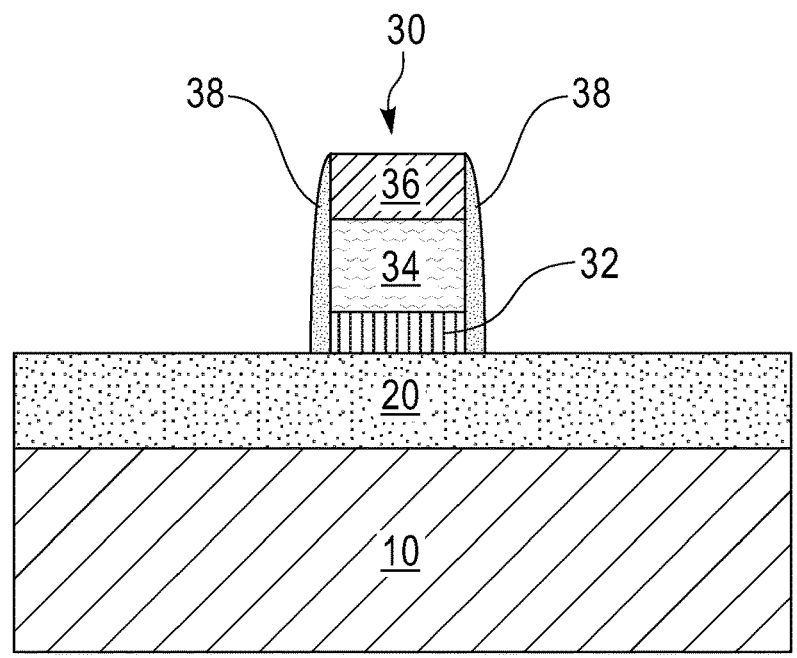
FIG. 1 is a cross-sectional view of an exemplary semiconductor structure after forming a gate structure over a compound semiconductor channel layer according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It should be noted that although the following description and drawings illustrate the basic processing steps employed to form source/drain contacts with low contact resistance for planar FETs, the basic concept of the present application can be applied to form source/drain contacts with low contact resistance in non-planar devices such as FinFETs and nanowire FETs as well.

Referring to FIG. 1, an exemplary semiconductor structure according to an embodiment of the present application includes a substrate and a gate structure 30 formed on the substrate. The substrate includes a vertical stack of, from bottom to top, a compound semiconductor substrate layer 10 and a compound semiconductor channel layer 20.

The compound semiconductor substrate layer 10 can include a first III-V compound semiconductor material that includes at least one element from Group III of the Periodic Table of Elements and at least one element from Group V of the Periodic Table of Elements. Exemplary III-V compound semiconductor materials that can be used in the present application as the compound semiconductor substrate layer 10 include, but are not limited to, GaAs, InAs, InP, InGaAs, InAlAs, InAlAsSb, InAlAsP and InGaAsP. The first III-V compound semiconductor material can be a single crystalline compound semiconductor material. In one embodiment, the III-V compound semiconductor substrate 10 includes single crystalline InP.

The compound semiconductor channel layer 20 can include a second III-V compound semiconductor material that is the same as, or different from, the first III-V compound semiconductor material providing the compound semiconductor substrate layer 10. For example, the second III-V compound semiconductor material can be GaAs, InAs, InP, InGaAs, InAlAs, InAlAsSb, InAlAsP or InGaAsP. In one embodiment and when the compound semiconductor substrate layer 10 includes InP, the compound semiconductor channel layer 20 can include InGaAs.

The compound semiconductor channel layer 20 can be formed utilizing an epitaxial growth process such as, for example, molecular beam epitaxy (MBE), metalorgano chemical vapor deposition (MOCVD) or migration enhanced epitaxy. The compound semiconductor channel layer 20 thus formed is epitaxially aligned to the compound semiconductor substrate layer 10. By "epitaxially aligned" it is meant that the compound semiconductor channel layer 20 has a same crystal orientation as that of the underlying compound semiconductor substrate layer 10. In one embodiment and when the compound semiconductor substrate layer 10 includes single crystalline InP, the compound semiconductor channel layer 20 can include single crystalline InGaAs. The thickness of the compound semiconductor channel layer 20 can be from 10 nm to 200 nm, although lesser and greater thicknesses can also be employed.

The gate structure 30 is formed on a top surface of the compound semiconductor channel layer 20. Although a single gate structure 30 is described and illustrated, the present application can be employed when a plurality of gate structures are formed. The gate structure 30 includes a gate stack and a gate spacer 38 formed on sidewalls of the gate stack. The gate stack may include, from bottom to top, a gate dielectric 32, a gate electrode 34 and a gate cap 36. The gate stack can be formed by first providing a material stack (not shown) that includes, from bottom to top, a gate dielectric layer, a gate electrode layer and a gate cap layer over the compound semiconductor channel layer 20.

The gate dielectric layer may include an oxide, nitride or oxynitride. In one example, the gate dielectric layer may include a high-k material having a dielectric constant greater than silicon dioxide. Exemplary high-k dielectrics include, but are not limited to, $HfO_2$, $ZrO_2$, $La2O3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed. The gate dielectric layer can be formed by any deposition technique including, for example, chemical vapor deposition (CVD), plasma enhanced chemical vapor deposition (PECVD), physical vapor deposition (PVD) or atomic layer deposition (ALD). The thickness of the gate dielectric layer can be from 0.5 nm to 10 nm, with a thickness from 0.5 nm to about 3 nm being more typical.

The gate electrode layer may include any conductive material including, for example, doped polysilicon, an elemental metal such as W, Ti, Ta, Al, Ni, Ru, Pd and Pt, an alloy of at least two elemental metals, a metal nitride such as WN and TiN, a metal silicide such as WSi, NiSi, and TiSi or multilayered combinations thereof. The gate electrode layer can be formed utilizing a deposition process including, for example, CVD, PECVD, PVD or ALD. In embodiments in which polysilicon or SiGe are used as the gate electrode material, an in-situ deposition process can be used or alternatively deposition followed by ion implantation can be used. The thickness of the gate electrode layer can be from 50 nm to 200 nm, although lesser or greater thicknesses can also be employed.

The gate cap layer may include a dielectric oxide, nitride or oxynitride. In one embodiment of the present application, the gate cap layer includes silicon nitride. The gate cap layer can be formed by a deposition process including, for example, CVD, PECVD, PVD or ALD. The thickness of the gate cap layer can be from 10 nm to 100 nm, although lesser or greater thicknesses can also be employed.

The material stack is then patterned and etched to form the gate stack (32, 34, 36). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such reaction ion etch (RIE). A remaining portion of the gate dielectric layer constitutes the gate dielectric 32, a remaining portion of the gate electrode layer constitutes the gate electrode 34, and a remaining portion of the gate cap layer constitutes the gate cap 36. The remaining photoresist layer may be subsequently removed by, for example, ashing.

In one embodiment, the gate stack (32, 34, 36) can be a sacrificial gate stack that is subsequently removed, and replaced with a functional gate stack including a functional gate dielectric, a functional gate electrode and a functional gate cap after forming source and drain regions of the semiconductor structure. The term "functional gate stack" as used herein refers to a permanent gate stack used to control output current (i.e., flow of carriers in the channel) of a semiconductor device through electrical fields or magnetic fields.

The gate spacer 38 may include a dielectric material such as, for example, an oxide, a nitride, an oxynitride, or any combination thereof. In one embodiment, the gate spacer 38 is composed of silicon nitride. The gate spacer 38 can be formed by first providing a conformal gate spacer material layer (not shown) on exposed surfaces of the gate stack (32, 34, 36) and the III-V compound semiconductor channel layer 20 and then etching the gate spacer material layer to remove horizontal portions of the gate spacer material layer. The gate spacer material layer can be provided by a deposition process including, for example, CVD, PECVD or ALD. The etching of the gate spacer material layer may be performed by a dry etch process such as, for example, RIE. The remaining portion of the gate spacer material layer constitutes the gate spacer 38. The width of the gate spacer 38, as measured at the base of the gate spacer 38 can be from 5 nm to 100 nm, although lesser and greater widths can also be employed.

Figure 2:
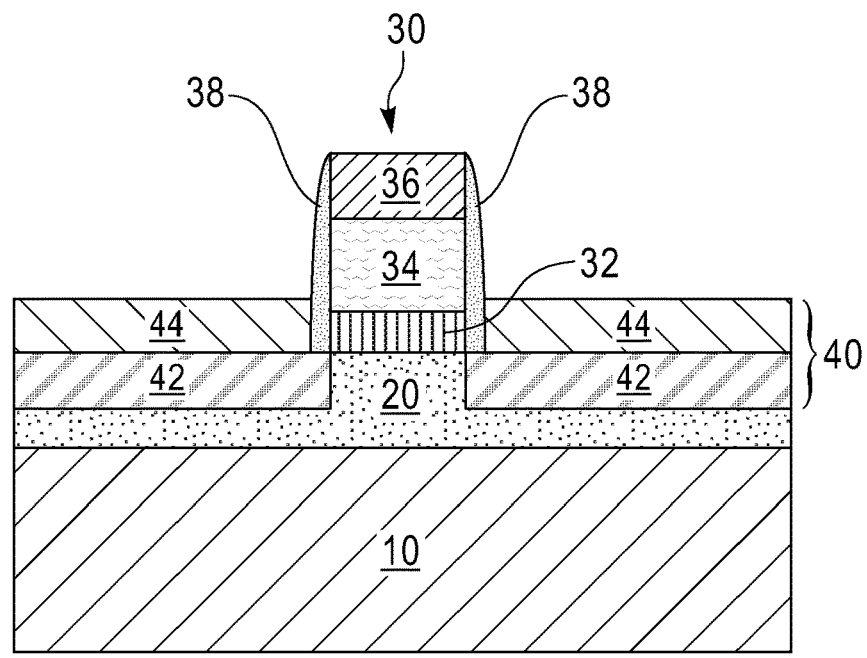
FIG. 2 is a cross-sectional view of the exemplary semiconductor structure of FIG. 1 after forming source/drain regions on opposite sides of the gate structure.

Referring to FIG. 2, a source region and a drain region (collectively referred to as source/drain regions 40) are formed on opposite sides of the gate structure 30. The source/drain regions 40 can include planar source/drain regions 42 located within the compound semiconductor channel layer 20 and raised source/drain regions 44 located on the planar source/drain regions 42. The raised source/drain regions 44 are optional and can be omitted in some embodiments of the present application.

The planar source/drain regions 42 can be formed using, for example, an ion implantation process, during which n-type dopants are implanted into portions of the compound semiconductor channel layer 20 that are not covered by the gate stack (32, 34, 36) using the gate stack (32, 34, 36) as an implantation mask. Exemplary n-type dopants include, but are not limited to, Si, Ge, Sn and Te. A portion of the compound semiconductor channel layer 20 that is laterally surrounded by the planar source/drain regions 42 constitutes a channel region of a FET. An activation anneal can be subsequently performed to activate the implanted dopants in the planar source/drain regions 42.

The raised source/drain regions 44 can include an n-doped compound semiconductor material. The III-V compound semiconductor material that provides the raised source/drain regions 44 can be the same as, or different from, the III-V compound semiconductor material that provides the planar source/drain regions 42 (i.e., the second III-V compound semiconductor material that provides the compound semiconductor channel layer 20). For example, the III-V compound semiconductor material that can be used as the raised source/drain regions 44 includes, but not limited to, GaAs, InAs, InP, InGaAs, InAlAs, InAlAsSb, InAlAsP and InGaAsP. In one embodiment, each of the planar source/drain regions 42 and the raised source/drain region 44 includes Si doped InGaAs.

The raised source/drain regions 44 can be formed by selective epitaxy. During the selective epitaxy process, the deposited III-V compound semiconductor material grows only on exposed semiconductor regions, i.e., the planar source/drain regions 42 and does not grow on dielectric surfaces, such as surfaces of the gate caps 36 and the gate spacers 38. The raised source/drain regions 44 are epitaxially aligned to the planar source/drain regions 42.

In one embodiment, the raised source/drain regions 44 are formed as intrinsic semiconductor regions, i.e., regions including an intrinsic semiconductor material. In this embodiment, no dopant gas is flowed during the selective epitaxy. The raised source/drain regions 44 are then doped with n-type dopants. The n-type dopants can be introduced, for example, by ion implantation, or by outdiffusion from a disposable dopant-containing material layer (not shown) such as an arsenosilicate glass layer. In some cases, the processing steps of formation of planar source/drain regions 42 may be omitted and the doping of the compound semiconductor channel layer 20 for formation of the source/drain regions 42 can be performed at this step simultaneously with the doping of the raised source/drain regions 44. In such cases, the implantation energy and/or dopant drive-in conditions are adjusted to ensure that n-type dopants reach portions of the compound semiconductor channel layer 20 through the raised source/drain regions 44. An activation anneal can be performed to activate the implanted dopants in the raised source/drain regions 44 and/or the planar source/drain regions 42.

In another embodiment, the raised source/drain regions 44 are formed as doped semiconductor regions. In this embodiment, a dopant gas is flowed during the selective epitaxy to provide in-situ doping.

Figure 3:
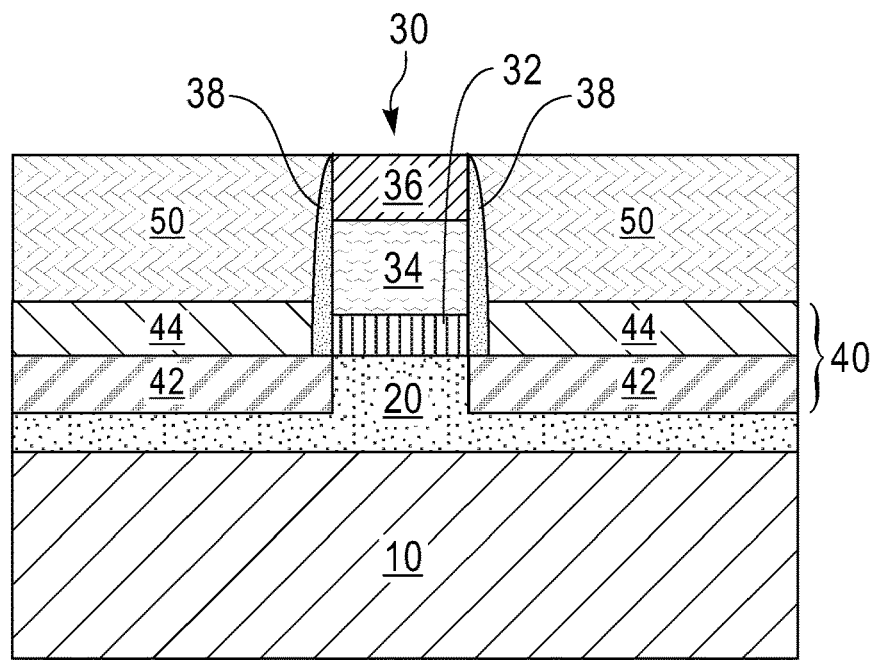
FIG. 3 is a cross-sectional view of the exemplary semiconductor structure of FIG. 2 after forming an interlevel dielectric (ILD) layer over the source/drain regions.

Referring to FIG. 3, an interlevel dielectric (ILD) layer 50 is formed over the raised source/drain regions 44. The ILD layer 50 laterally surrounds the gate structure 30. In some embodiments of the present application, the ILD layer 50 is composed of a dielectric material that can be easily planarized. For example, the ILD layer 50 can include an undoped silicon oxide, doped silicon oxide, silicon nitride, porous or non-porous organosilicate glass, porous or non-porous nitrogen-doped organosilicate glass, or a combination thereof. The ILD layer 50 can be deposited using a conventional deposition process, such as, for example, CVD, PECVD or spin coating. If the ILD layer 50 is not self-planarizing, following the deposition of the ILD layer 50, the ILD layer 50 can be subsequently planarized, for example, by chemical mechanical planarization (CMP). The planarized top surface of the ILD layer 50 is coplanar with the topmost surfaces of the gate structure 30 (i.e., the top surfaces of the gate cap 36).

Figure 4:
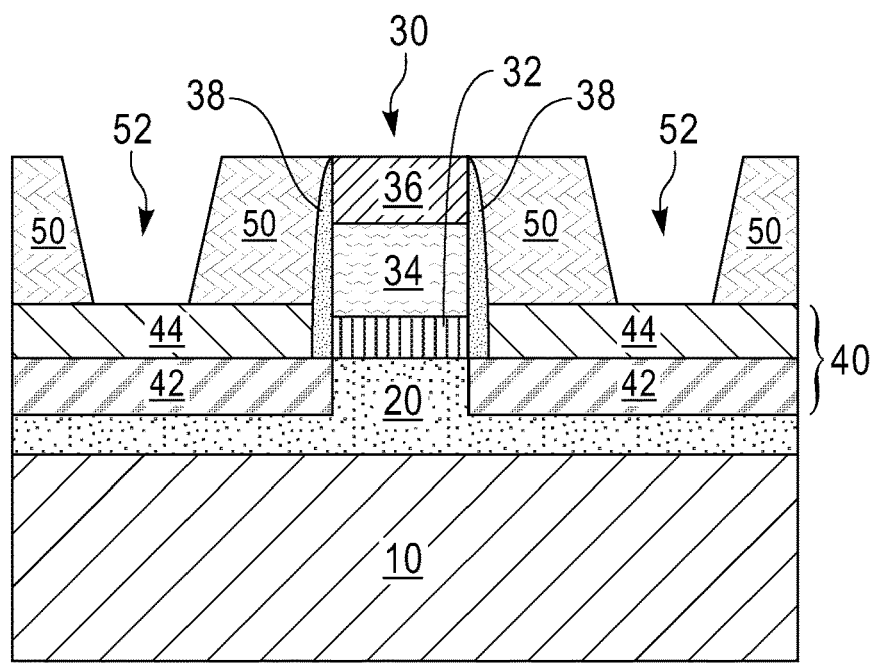
FIG. 4 is a cross-sectional view of the exemplary semiconductor structure of FIG. 3 after forming source/drain contact openings extending through the ILD layer to expose portions of the source/drain regions.

Referring to FIG. 4, source/drain contact openings 52 are formed. Each source/drain contact opening 52 extends through the ILD layer 50 to expose a portion of one of the source/drain regions 40. The source/drain contact openings 52 can be formed by applying a mask layer (not shown) over the ILD layer 50, and then lithographically patterning the mask layer to form openings therein. Each opening overlies a portion of one of the source/drain regions 40. The mask layer can be a photoresist layer or a photoresist layer in conjunction with hardmask layer(s). The pattern in the mask layer is transferred through the ILD layer 50 to form the source/drain contact openings 52. In one embodiment of the present application, RIE may be performed to remove portions of the ILD layer 50 that are not covered by the remaining mask layer to expose portions of the source/drain regions 40 within the source/drain contact openings 52. The RIE chemistry is selected depending on the dielectric material of the ILD layer 50. After forming the source/drain contact openings 52, the remaining mask layer can be removed, for example, by oxygen-based plasma etching.

Figure 5:
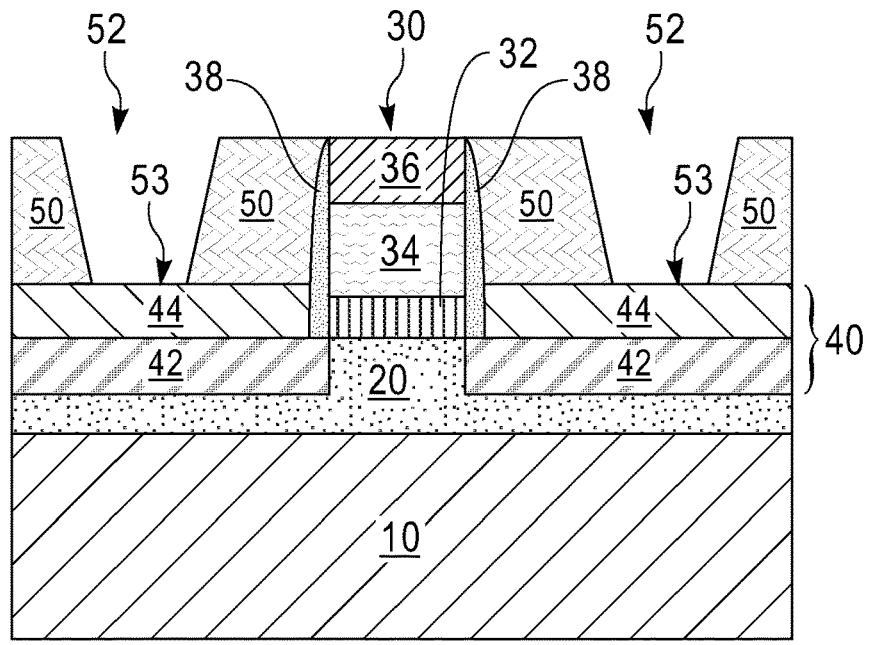
FIG. 5 is a cross-sectional view of the exemplary semiconductor structure of FIG. 4 after removing native oxides from surfaces of the exposed portions of the source/drain regions to provide treated surfaces.

Referring to FIG. 5, surfaces of the source/drain regions 40 that are exposed by the source/drain contact openings 52 are cleaned to remove any native oxide present thereon. The native oxides that are present on the surfaces of the source/drain regions 40 typically includes at least an oxide of one of the elements of the III-V compound semiconductor material that provides the raised source/drain regions 44, if present, or the III-V compound semiconductor material that provides the planar source/drain regions 42. For example, if the raised source/drain regions 44 or the planar source/drain regions 42 are composed of InGaAs, the sources of the source/drain regions 40 would include an oxide of In, an oxide of Ga and/or an oxide of As.

The native oxides can be removed from the surfaces of the source/drain regions 40 by a wet chemical etch followed by a dry etch. The wet chemical etch may include, for example, a HF or HCl wet etch. The dry etch may include a hydrogen, helium or helium/hydrogen plasma process. In one embodiment, the structure of FIG. 4 is dipped into a 3% HF/H$_2$O solution for about 30 seconds to remove parts of the native oxide and transferred into a vacuum chamber for the plasma treatment. In the plasma chamber, the surfaces of exposed portions of the source/drain regions 40 are exposed to a radio-frequency generated hydrogen/helium plasma at a temperate of about 40° C. for approximately 10 seconds. As a result a treated surface 53 containing essentially no oxides and other contaminates is thus provided at the bottom of each of the source/drain region contact openings 52. By "essentially free of oxide" it is meant that the oxide content is about $10^{-2}$ of a monolayer or less.

After removal of native oxide from surfaces of the source/drain regions 40, free radicals of n-type dopants (e.g., Si, Ge, Sn or Te) which are ionized by plasma excitation are introduced to the treated surfaces 53 as dopants. In one embodiment and when Si is employed as n-type dopants, Si-containing gases such as, for example, SiH$_4$, Si$_2$H$_6$ and Si$_3$H$_8$, are flowed into the plasma chamber and ionized as Si$^+$, Si$_2^+$, Si$_3^+$ free radicals. These free radicals react to the treated surfaces 53 as dopants in the source/drain regions 40.

Figure 6:
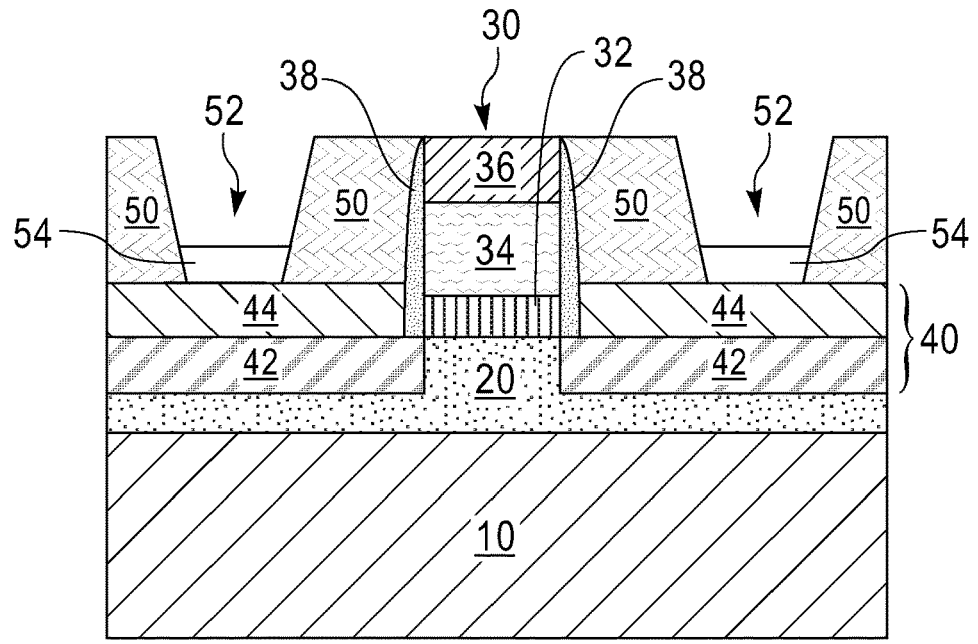
FIG. 6 is a cross-sectional view of the exemplary semiconductor structure of FIG. 5 after in-situ forming semiconductor caps over the treated surfaces.

Referring to FIG. 6, a semiconductor cap 54 is formed at a bottom of each of the source/drain contact openings 52. The semiconductor caps 54 can be formed by selective epitaxy that deposits a semiconductor material only on semiconductor surfaces, i.e., the treated surfaces 53 of the source/drain regions 40, but not on dielectric surfaces such as surfaces of the gate cap 36, the gate spacer 38 and the ILD layer 50. For example, the semiconductor caps 54 can be formed by MBE or CVD or plasma ionization. Exemplary semiconductor materials can be used as the semiconductor caps 54 include, but are not limited to, Si, Ge and SiGe. In one embodiment, each semiconductor cap 54 is composed of Si. In the present application, the semiconducting caps 54 are formed in-situ in the same reaction chamber as used for providing the treated surfaces 53. The semiconductor caps 54 thus passivate the previously cleaned and doped III-V compound semiconductor surfaces of the source/drain regions 40 (i.e., the treated surfaces 53), preventing re-oxidation of the treated surfaces 53. As a result, the contact resistance of source/drain contacts later formed can be greatly reduced. The thickness of each semiconductor cap 53 can be from 1 nm to 10 nm, although lesser and greater thicknesses can also be employed.

Figure 7:
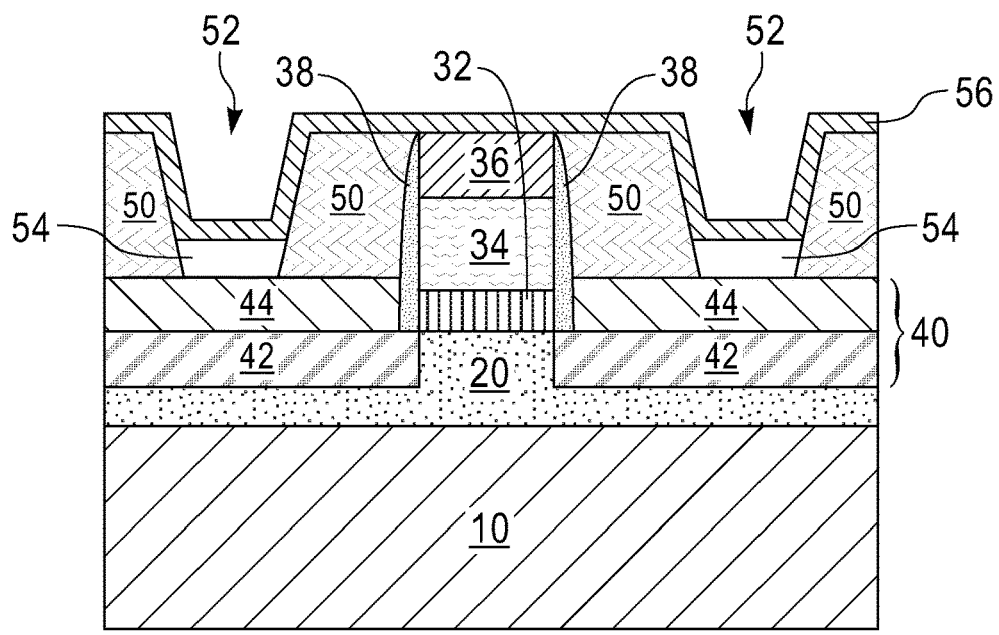
FIG. 7 is a cross-sectional view of the exemplary semiconductor structure of FIG. 6 after forming a metal layer over the semiconductor caps, the ILD layer and the gate structure.

Referring to FIG. 7, a metal layer 56 is formed along sidewalls of the source/drain contact openings 52 and over top surfaces of the gate structure 30, the ILD layer 50 and the semiconductor caps 54. The metal layer 56 can include a metal such as Ti, Ta, Ni, Co, Pt, W, TiN, TaN, an alloy thereof, or a stack thereof such as Ti/TiN and Ti/WC. In one embodiment, the metal layer 56 is composed of Ti/TiN. The metal layer 56 can be formed, for example, by CVD, PVD or ALD. The thickness of the metal layer 56 can be from 2 nm to 20 nm, although lesser and grater thicknesses can also be employed.

Figure 8:
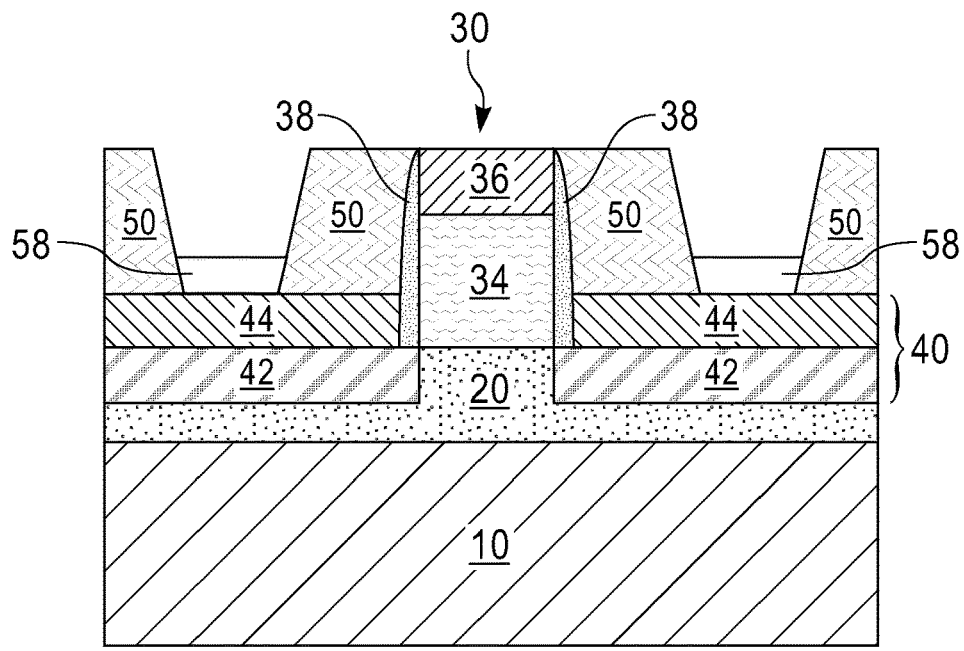
FIG. 8 is a cross-sectional view of the exemplary semiconductor structure of FIG. 7 after forming metal semiconductor alloy regions over the treated surfaces.

Referring to FIG. 8, the semiconductor caps 54 are converted into metal semiconductor alloy regions 58. The metal semiconductor alloy regions 58 are located at bottom of the source/drain contact opening 52, contacting the source/drain regions 40. The metal semiconductor alloy regions 58 may be composed of a silicide or germicide. An anneal is performed at an elevated temperature (e.g., 200° C. to 600° C.) to induce reaction of the semiconductor material of the semiconductor caps 54 and the metal in the metal layer 56 to provide the metal semiconductor alloy regions 58. The unreacted portion of the metal layer 56 is then removed, for example, by an etch, which can be a wet etch that removes the metal in the metal layer 56 selective to the metal semiconductor alloy in the metal semiconductor alloy regions 58. The wet etch can be combined with a post-clean that removes any remnants of the metal layer 56 from the exposed surfaces of the ILD layer 50 in the source/drain contact openings 52.

Figure 9:
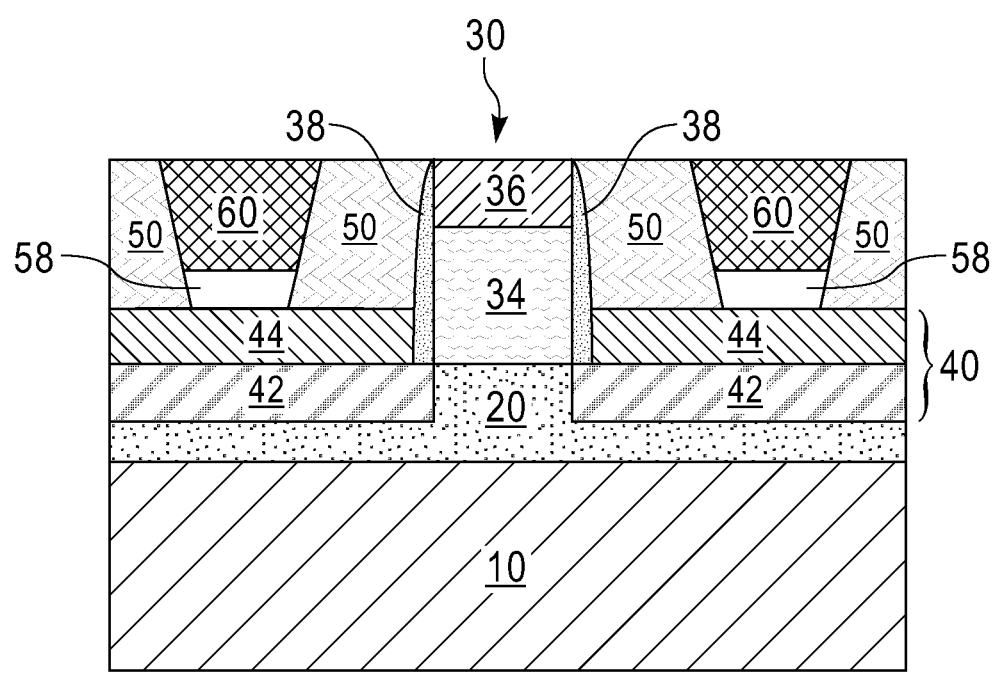
FIG. 9 is a cross-sectional view of the exemplary semiconductor structure of FIG. 8 after forming source/drain contacts over the metal semiconductor alloy regions in the source/drain contact openings.

Referring to FIG. 9, source/drain contacts 60 are formed in the source/drain contact openings 52, contacting the metal semiconductor alloy regions 58. The source/drain contacts 60 can be formed by depositing a conductive material layer (not shown) to completely fill the source/drain contact openings 52. The conductive material layer may include a metal such as, for example, W, Al, Cu or their alloys. The conductive material layer can be formed by any suitable deposition method such as, for example, CVD, PVD or plating. Portions of the conductive material layer that are located above the top surface of the ILD layer 50 are then removed by employing a planarization process, such as, for example, CMP. Remaining portions of the conductive material layer located within the source/drain contact openings 52 constitute the source/drain contacts 60.

Optionally, contact liners (not shown) may be formed on the sidewalls of the source/drain contract openings 52 and the top surfaces of the metal semiconductor alloy regions 58 before filling the source/drain contact openings 52 with the conductive material layer. The contact liners may include TiN or TaN.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:

forming source/drain regions on opposite sides of a gate structure and within a compound semiconductor channel layer, wherein the compound semiconductor channel layer is composed of a III-V compound semiconductor material and is located directly on a compound semiconductor substrate layer and wherein the source/drain regions are n-doped;

forming source/drain contact openings extending through an interlevel dielectric (ILD) layer that overlies the source/drain regions and laterally surrounds the gate structure, each of the source/drain contact openings exposing a portion of one of the source/drain regions;

removing native oxides from the top surface of the exposed portion of each of the source/drain regions to provide a treated source/drain surface;

performing plasma doping to introduce a free radical of an n-type dopant to the treated source/drain surface of each source/drain region, wherein the free-radical of the n-type dopant is selected from the group consisting of Sn radical, Te radicals and Si radicals;

forming, by selective epitaxy, a semiconductor cap only within the source/drain contact openings and extending upwards from the plasma doped and treated source/ drain surface of each of the source/drain regions, wherein the removing of the native oxides and the selective epitaxy are performed in a same reactor chamber and wherein the semiconductor cap passivates the plasma doped and treated source/drain surface;

forming a metal layer over exposed surfaces of the ILD layer, the gate structure and each semiconductor cap;

forming metal semiconductor alloy regions within the source/drain contact openings by reacting an entirety of each semiconductor cap with the metal layer, wherein each of the metal semiconductor alloy regions is located at a bottom of one of the source/drain contact openings and in direct contact with a top surface of the exposed portion of one of the source/drain regions; and forming source/drain contacts within the source/drain contact openings, each of the source/drain contacts contacting a top surface of one of the metal semiconductor alloy regions, wherein the source/drain contacts have a contact resistance that is lower than $5 \times 10^{-9}$ ohm-cm$^2$, and wherein the source/drain regions comprise planar source/drain regions located within the compound semiconductor channel layer and raised source/drain regions, the raised source/drain regions having a same type of doping as the planar source/drain regions, and wherein each of the raised source/drain regions comprises a same III-V compound semiconductor material as the planar source/drain regions.

2. The method of claim 1, wherein the treated source/drain surface of the exposed portion of each of the source/drain regions is essentially free of the native oxides.

3. The method of claim 1, wherein the removing the native oxides comprises:
performing a wet etch using a diluted hydrofluoric acid (HF) solution; and
performing a dry etch using a hydrogen plasma process.

4. The method of claim 1, wherein each of the semiconductor caps comprises Si, Ge or SiGe.

5. The method of claim 1, wherein the compound semiconductor channel layer comprises GaAs, InAs, InP, InGaAs, InAlAs, InAlAsSb, InAlAsP or InGaAsP.

6. The method of claim 1, wherein each of the raised source/drain regions comprises Si doped InGaAs.

7. The method of claim 1, wherein the forming the planar source/drain regions are performed by implanting ion into portions of the compound semiconductor channel layer that are not covered by the gate structure.

8. The method of claim 1, wherein the compound semiconductor channel layer is composed of a different compound semiconductor material than the compound semiconductor substrate layer.

9. The method of claim 8, wherein the compound semiconductor channel layer comprises InGaAs, and the compound semiconductor substrate layer comprises InP.

10. The method of claim 1, further comprising forming the gate structure on the compound semiconductor channel layer, wherein the forming the gate structure comprises:
forming a material stack including, from bottom to top, a gate dielectric layer, a gate electrode layer and a gate cap layer on the compound semiconductor channel layer; and
patterning the material stack to provide a gate stack including, from bottom to top, a gate dielectric, a gate electrode and a gate cap; and
forming a gate spacer on sidewalls of the gate stack.

11. The method of claim 1, wherein the forming metal semiconductor alloy regions is performed by an anneal process.

12. The method of claim 1, further comprising removing an unreacted portion of the metal layer after the forming the metal semiconductor alloy regions.

13. The method of claim 12, further comprising a post-clean that removes any remnants of the metal layer from the exposed surfaces of the ILD layer in the source/drain contact openings.

14. The method of claim 13, wherein the forming source/drain contacts within the source/drain contact opening comprises:
depositing a conductive material layer on the ILD layer and the metal semiconductor alloy regions to completely fill the source/drain contact openings; and
removing portions of the conductive material layer from a top surface of the ILD layer.

15. The method of claim 1, wherein the source/drain regions are single crystalline and the semiconductor cap is also single crystalline.

* * * * *